(12) United States Patent
Cromwell et al.

(10) Patent No.: US 7,826,229 B2
(45) Date of Patent: Nov. 2, 2010

(54) COMPONENT RETENTION WITH DISTRIBUTED COMPRESSION

(75) Inventors: Stephen Daniel Cromwell, Roseville, CA (US); Stephan Karl Barsun, Davis, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 325 days.

(21) Appl. No.: 11/588,817

(22) Filed: Oct. 27, 2006

(65) Prior Publication Data
US 2008/0101033 A1 May 1, 2008

(51) Int. Cl.
H05K 7/20 (2006.01)
F28F 7/00 (2006.01)
H01L 23/34 (2006.01)
H01R 13/62 (2006.01)

(52) U.S. Cl. ............... 361/719; 165/80.2; 165/80.3; 165/185; 257/719; 361/704; 361/710; 439/487

(58) Field of Classification Search ............... 361/719; 257/718–719; 439/485, 487
See application file for complete search history.

(56) References Cited

U.S. PATENT DOCUMENTS

| 4,278,311 | A  | * | 7/1981  | Scheingold et al. | ...... 439/71  |
| 4,460,223 | A  | * | 7/1984  | Brown et al.      | ...... 439/95  |
| 5,590,025 | A  |   | 12/1996 | Clemens           |                |
| 5,677,829 | A  |   | 10/1997 | Clemens           |                |
| 6,118,657 | A  |   | 9/2000  | Clemens           |                |
| 6,347,036 | B1 | * | 2/2002  | Yeager et al.     | ...... 361/687 |
| 7,187,552 | B1 | * | 3/2007  | Stewart et al.    | ...... 361/704 |
| 7,195,507 | B2 | * | 3/2007  | Watanabe          | ...... 439/331 |
| 2003/0035280 | A1 |  | 2/2003 | Malone et al.     |                |
| 2004/0038583 | A1 |  | 2/2004 | Peterson et al.   |                |
| 2004/0246679 | A1 |  | 12/2004 | Cromwell         |                |
| 2004/0247925 | A1 |  | 12/2004 | Cromwell         |                |
| 2004/0257771 | A1 | * | 12/2004 | Shinotou        | ...... 361/704 |
| 2005/0007748 | A1 |  | 1/2005 | Callahan et al.  |                |
| 2007/0030652 | A1 | * | 2/2007 | Chen             | ...... 361/704 |

* cited by examiner

*Primary Examiner*—Gregory D Thompson

(57) ABSTRACT

A retention assembly comprises a hinged load plate configured for rotational closure over a component and compression of a pre-compressed spring that distributes force of the spring across the component in tool-less retention of the component.

20 Claims, 8 Drawing Sheets

COMPONENT RETENTION WITH DISTRIBUTED COMPRESSION

BACKGROUND

Computer systems have evolved to make computers and components smaller, faster, and more powerful, creating new engineering concerns including forming many robust electrical connections in very small spaces, enabling near-zero tolerance flatness of component casings, selecting materials to minimize differences in the coefficients of thermal expansion between the different types of conductive and non-conductive materials used in electronic components. In many data processing systems such as computer systems, programmable electronic systems, telecommunication switching systems, control systems, and the like, electrical components including processors, integrated circuits, memory chips, and application specific integrated circuits (ASICs) are assembled on substrates such as printed circuit boards, other flexible substrates, multi-chip modules, and others. Computer designers have increased power, size and quantity of chips attached to printed circuit boards (PCBs), creating a challenge in cooling the components and systems as well making difficult handling of assembled components due to dense arrangement.

One type of electronic component is a field-replaceable-unit (FRU), an assembly, part, or circuit board that facilitates quick and simple removal from a system and replacement, for example by a user, without transporting the system or product to a repair facility. Examples of FRUs include processor or central processing unit (CPU) modules, memory modules, heat sink assemblies, fans, storage devices, and many others. Operation of FRUs and other components often depends on adequate electrical contact among components and other elements which, in turn, is enabled by compressive force on the assembly.

Various techniques have been employed to supply compressive force on the component assembly, such as clamping with combinations of compressive screws, helical springs, and/or loading plates Shoulder screws and springs have typically been used to apply force to a heat sink, which can unevenly load the heat sink as the springs are torqued down. Often attachment hardware includes many pieces to attain some degree of even force distribution and employs tools to install or service a component under the heat sink. Furthermore, screws can generate metal debris that can short-circuit system components. Usage of threaded fasteners can involve substantial time for assembly and negatively influences customer satisfaction.

SUMMARY

In accordance with an embodiment of a retention assembly, a hinged load plate is configured for rotational closure over a component and compression of a pre-compressed spring that distributes force of the spring across the component in tool-less retention of the component.

BRIEF DESCRIPTION OF THE DRAWINGS

Embodiments of the invention relating to both structure and method of operation may best be understood by referring to the following description and accompanying drawings.

DETAILED DESCRIPTION

A lever-activated z-axis spring can be used for component attachment.

An embodiment of an electronic heat sink retention device can use a load plate that compresses a z-axis spring to apply a distributed force to retain a component such as a heat sink. The z-axis spring can be held in a substantially pre-compressed state so that the retention assembly can account for less than the full travel distance of the spring.

In some applications, the illustrative component retention assembly enables tool-free heat sink retention, eliminating tools from the attachment process.

The illustrative component retention assembly can also enable uniform component retention forces, controlling component attachment force through a wide tolerance range.

Figure 1A:
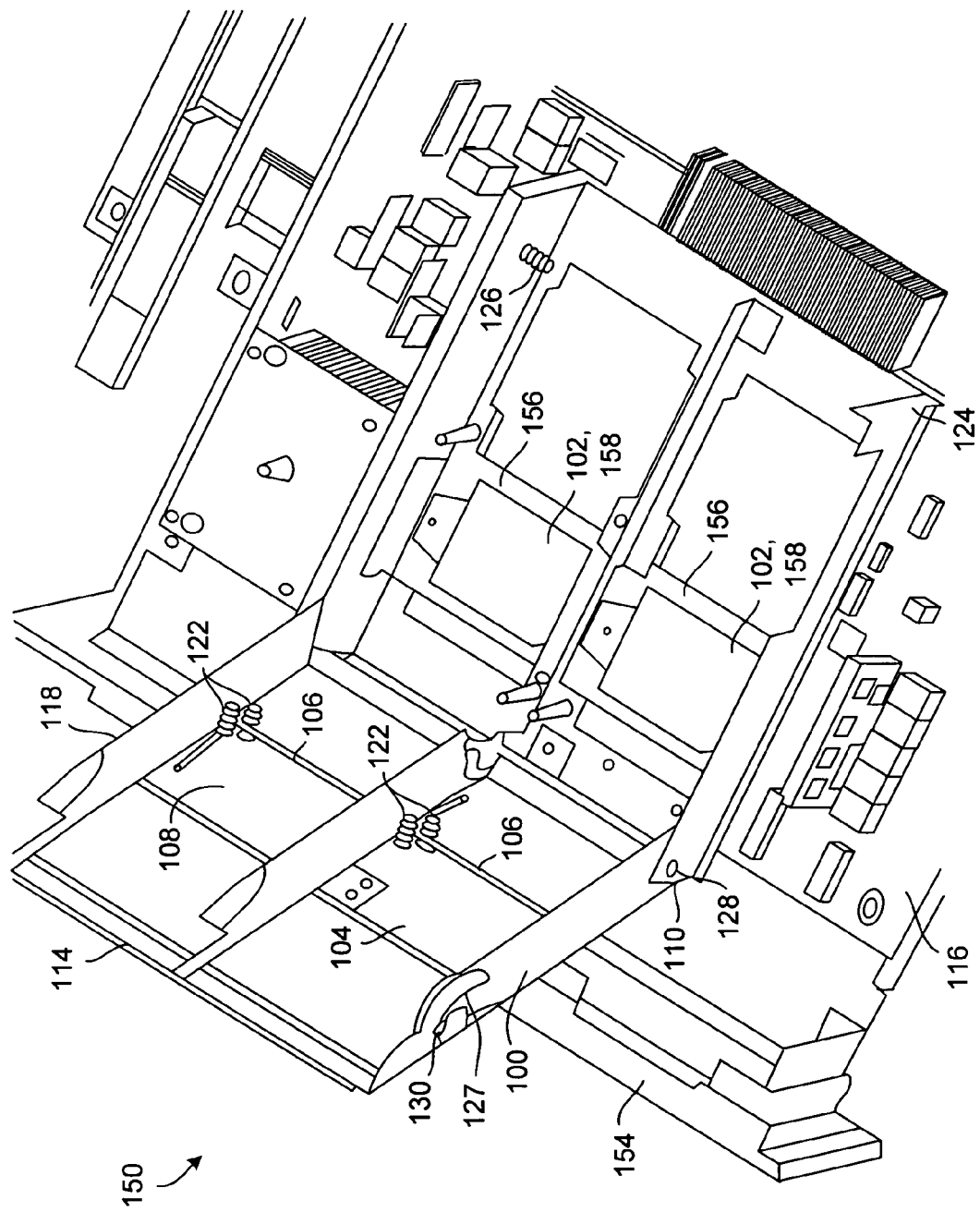
FIGS. 1A, 1B, 1C, 1D, 1E, and 1H are pictorial diagrams of overhead perspective views showing an embodiment of a retention assembly that is adapted to retain a component using distributed compression.
Figure 1B:
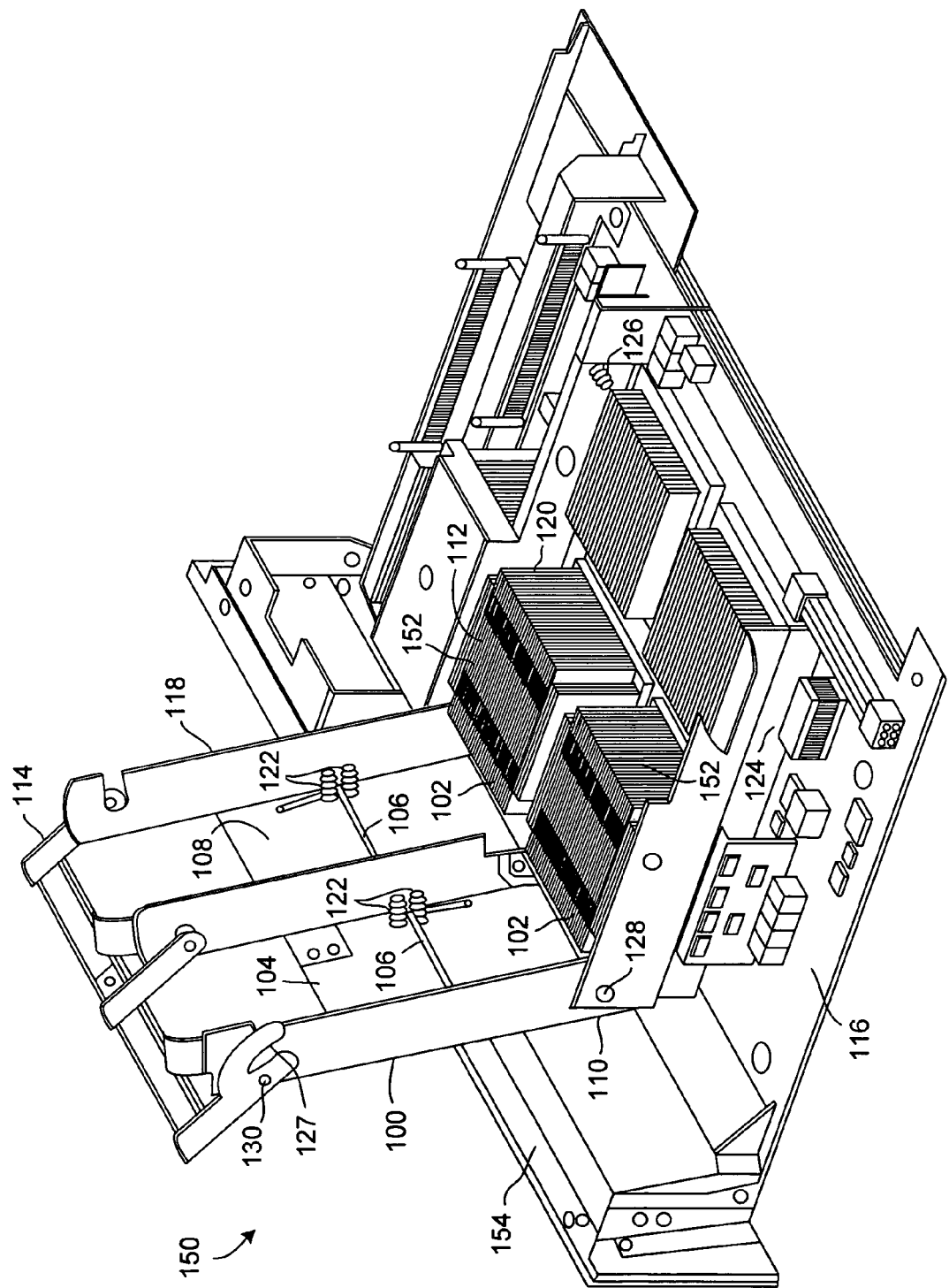
Figure 1C:
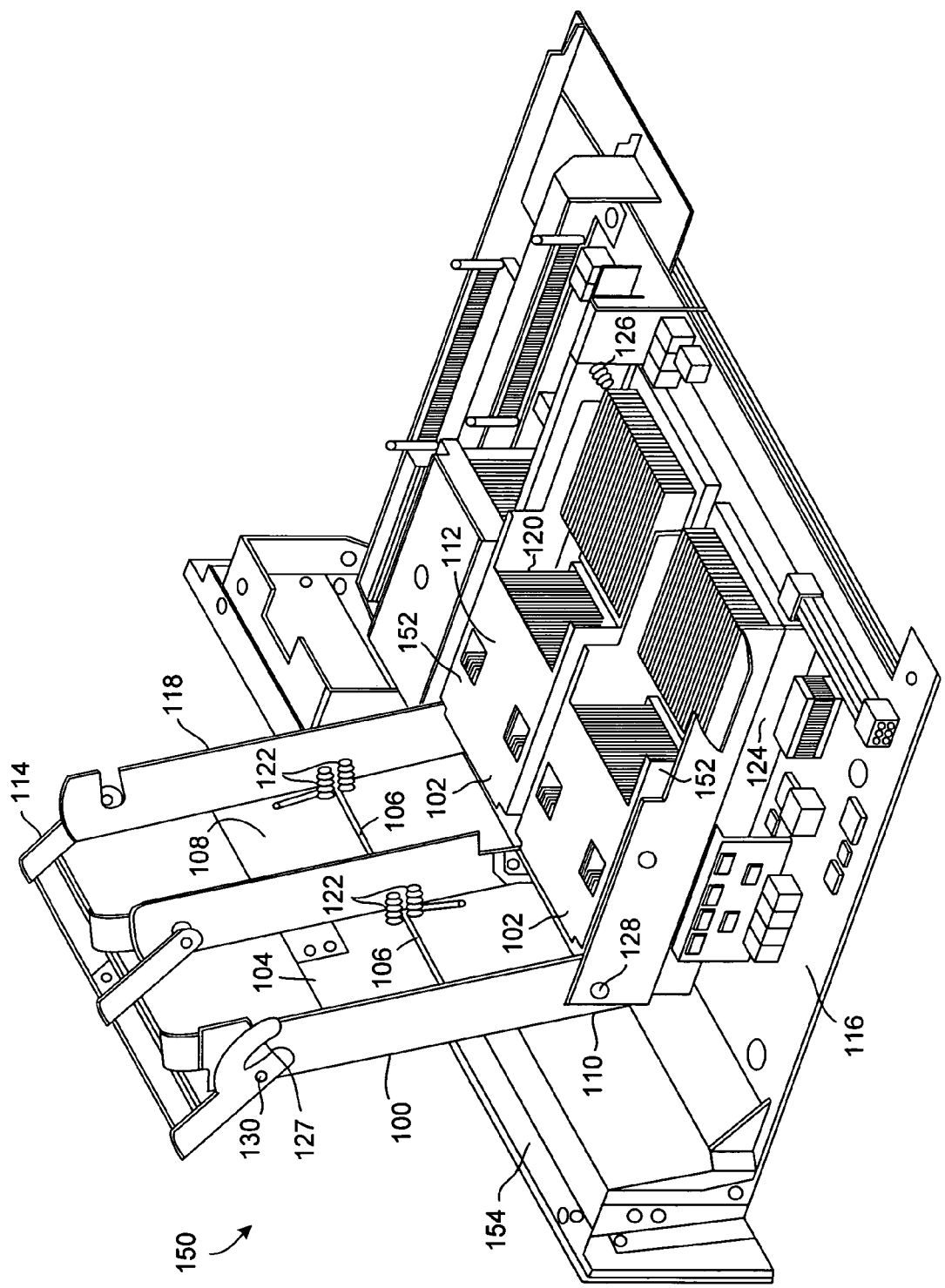
Figure 1F:
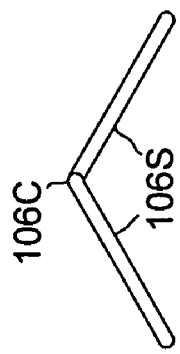
FIGS. 1F and 1G are pictorial diagrams depicting respective side view and perspective views of embodiments of a spring that can be used in the retention assembly.
Figure 1D:
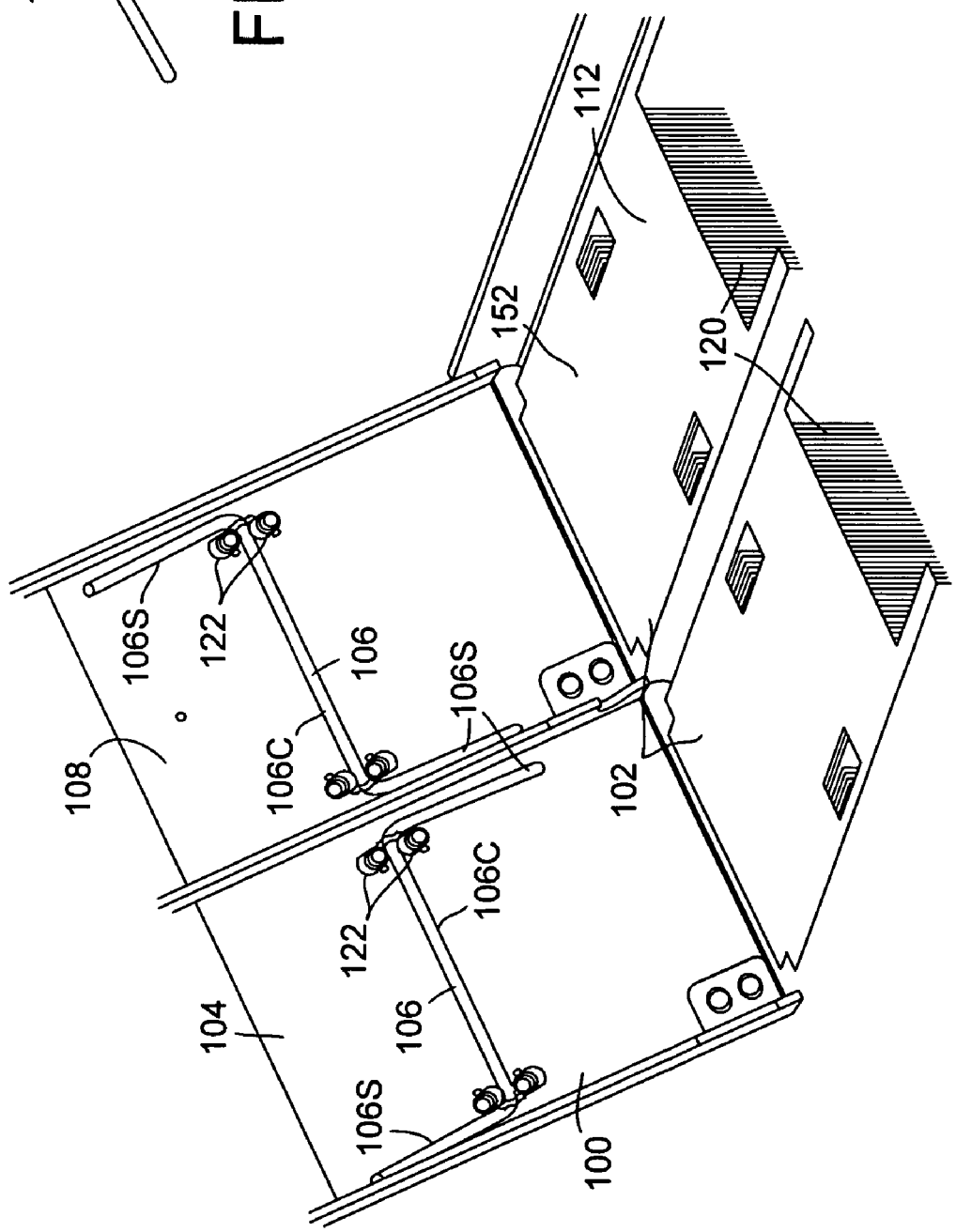
Figure 1E:
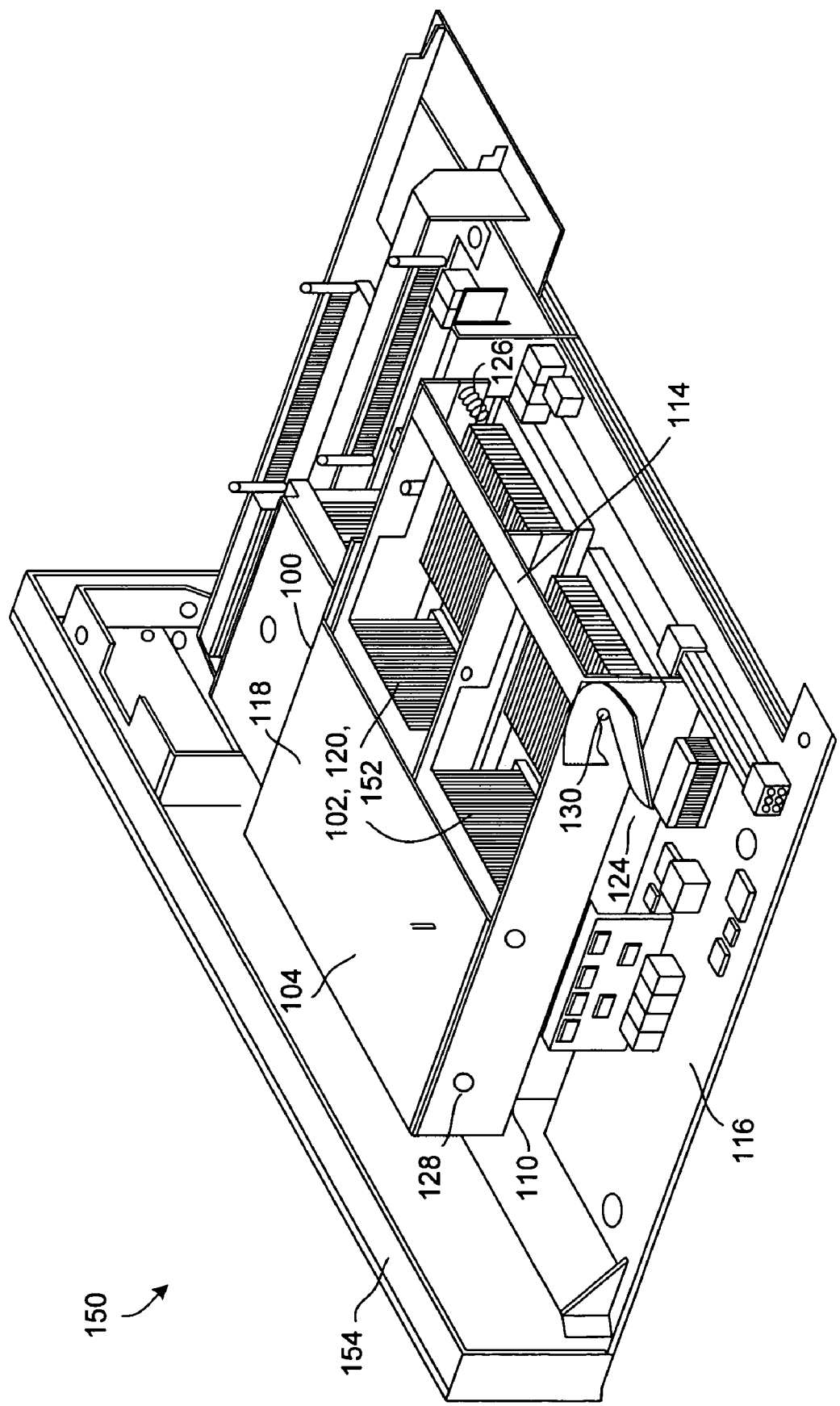

Referring to FIGS. 1A, 1B, 1C, 1D, and 1E, pictorial diagrams illustrate overhead perspective views showing an embodiment of a retention assembly 100 that is adapted to retain a component 102 using distributed compression. As depicted, the term component 102 is broadly construed as an assembly, for example a heat sink assembly or others, an integrated circuit chip, a socket, an assembly of multiple components, a field replaceable unit (FRU), or the like. FIG. 1A shows the retention assembly 100 in an open position prior to placement of a heat sink field-replaceable unit (FRU). FIG. 1B illustrates the retention assembly 100 in an open position after placement of a first type of heat sink FRU. FIG. 1C illustrates the retention assembly 100 in an open position after placement of a second type of heat sink FRU. FIG. 1E depicts the retention assembly 100 in a closed position. The illustrative retention assembly 100 comprises a hinged load plate 104 which is configured for rotational closure over the component 102 that compresses a pre-compressed spring 106, thereby distributing the force of the spring 106 across the component 102 in tool-less retention of the component 102. FIG. 1C is a magnified pictorial view of the retention assembly 100 illustrating the spring 106 and hardware 122 for pre-compressing the spring 106.

Figure 1G:
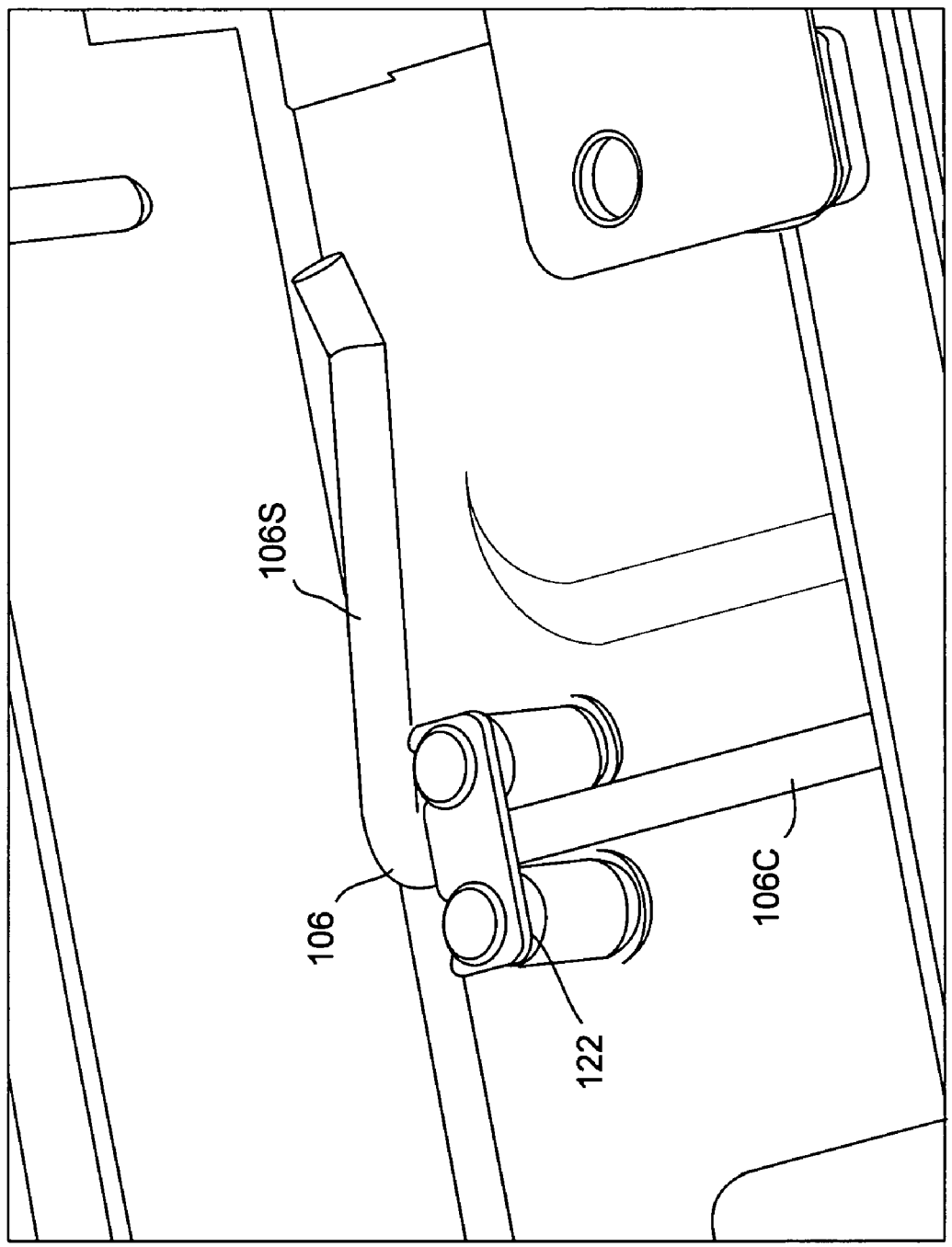

The illustrative spring 106 is a torsion-bar spring that is arranged to apply compression to the component 102. For example, the illustrative spring member 106 is a torsion bar with a central substantially straight segment 106C and lateral side segments 106S bent at perpendicular angles to the central straight segment 106C. The lateral side segments 106S are bent at angles into relatively different planes so that, when unconstrained, the central straight segment 106C is raised to an unloaded height, as shown in FIG. 1F. FIG. 1G shows a perspective view of an embodiment of the spring 106 and pre-compression hardware 122. When constrained by the hardware 122, the central segment 106C is held at a preloaded height. The illustrative side segments are bent in opposing directions. Other embodiments may be formed in different configurations. In other arrangements, side segments may be omitted or bent at angles different from perpendicular to the central segment. Similarly, other types of springs may be used such as flat springs, leaf springs, cone-disk or Belleville springs, ring springs, or any other suitable spring type. The illustrative spring 106 comprises a metallic material, such as stainless steel, that is resilient and that exhibits springiness when deflected from an original shape. Spring member 106 can have a stiffness based on thickness, geometry, type of material, and curvature that is selected to produce a compressive force sufficient to maintain a contact force that is within a minimum range such as 30 to 70 grams force per conductive element and that is substantially the same as the minimum contact forces at the edges and corners of the component 102. The biasing force exerted by spring member 106 is applied by closure of the load plate 104 to ensure a substantially uniform contact force across the component 102.

In some embodiments, the spring 106 may be a leaf spring although leaf springs are relatively stiff and have a limited working range. Therefore, tolerance variation in the component or assembly can adversely affect the force applied to the component.

As depicted, the spring member 106 applies a substantially uniformly-distributed compressive force without usage of a compressive screw. The spring member 106 functions as a force generator and distributor to ensure a substantially uniform contact force between the load plate 104 and the heat sink 120, and between the heat sink 120 to an integrated circuit 158 such as a processor, intervening structures in the component 102, for example a socket, and a base 124 coupled to a printed circuit board substrate 116.

The final load applied is a function of the z-axis tolerance loop of the components and the material variations that impact the spring rate of the spring 106. Component tolerances can be managed by careful design and specification but cannot be eliminated. In a particular design, tolerance, load, and spring rates are specified, resulting in a load tolerance due to component z-axis tolerances. Load tolerance due to spring rate variation of the spring can exceed component tolerances. Variation is most strongly a function of the spring wire diameter and material variations, and geometry.

Usage of a relatively soft spring to decrease the effect of tolerance variation enables use of standard material instead of special material rolled to tighter diameter tolerances. Standard stock material is less expensive and more widely available. Specially-toleranced material has to be ordered in mill run quantities and as a result has a large minimum order quantity and a large lead time.

As depicted in the illustrative embodiment of the retention assembly 100, the hinged load plate 104 can comprise a planar surface 108 that rotates about a hinge 110 to close over the component 102 with the load plate planar surface 108 aligned essentially parallel to a substantially planar surface 112 of the component 102. The pre-compressed spring 106 is shown coupled to the load plate 104 and can be configured to compress against the component 102 with a force aligned substantially perpendicular to the substantially planar surface 112 of the component 102.

A cam 114 can be coupled to the load plate 104 and configured to facilitate movement of the load plate 104 by compressing the pre-compressed spring 106 at a controlled force which is distributed over a substantially planar surface 112 of the component 102. The load plate 104 and spring 106 retain the component 102 with tool-less retention.

In some embodiments, the spring 106 can be a relatively soft spring to enable tolerance in dimensions in a z-axis stack of members that comprise the component 102. The pre-compressed spring 106 can be specified as a soft, low spring rate spring that is pre-compressed to a selected percentage of nominal working deflection. For example, the spring specification can call for a spring rate of less than 2000 lbs/in and pre-compression to 80% or less of the nominal working deflection. The depicted spring specification is for example purposes only. Any suitable spring rate and percentage of pre-compression can be selected. More generally, the pre-compressed spring 106 can be specified as a soft, low spring rate spring that decreases the effect of tolerance variation along the z-axis stack of members within the component 102 and distributes compression force uniformly on the component 102. The pre-compressed spring 106 functions as a force distributor that distributes contact force substantially uniformly across the component 102.

The spring 106 can be selected as substantially softer than coil springs that are conventionally used for attachment of components and is therefore pre-compressed to a selected height, for example approximately 75% of nominal working deflection. A softer spring is used to decrease the effect of tolerance variation within the z-axis stack of members in the component 102 and as a structure that maintains a more uniform force on the component. The spring 106 and load plate 104 can be used to simultaneously load multiple components, thereby saving space within a system and saving assembly time.

In particular, the spring 106 can be selected as a relatively soft spring to enable better control of tolerances. As depicted in FIG. 1F, the spring 106 is shown at a free state height with no load. The spring 106 is illustrated as a relatively tall free height or large displacement spring wherein the displacement can be defined as the difference between the free height and the working height. The spring rate (force divided by deflection) in combination with the displacement at which the spring operates determines the spring load. The large deflection spring is configured with precompression to attain a relatively low spring rate resolution and a relatively lower load tolerance resulting from z-axis variation in a stack of members in the component stack. With a relatively soft spring, a smaller load tolerance the spring load has at any particular working height, enabling better control of the load variance resulting from the z-axis component stack.

In some applications and/or arrangements, the retention assembly 100 can further comprise a base 124 configured for mounting the component 102 so that the hinged load plate 104 and the substrate 116 in combination form a clamshell structure 118 for enclosing and retaining the component 102.

In the illustrative example, the retention assembly 100, the hinged load plate 104, and the pre-compressed spring 106 are configured for retaining the component 102 which includes heat sink 120. In some embodiments, the retention assembly 100, hinged load plate 104, and pre-compressed spring 106 can be configured for retaining multiple components including, for example, integrated circuit devices, heat sinks, electronic components, electro-optical components, and the like.

Figure 1H:
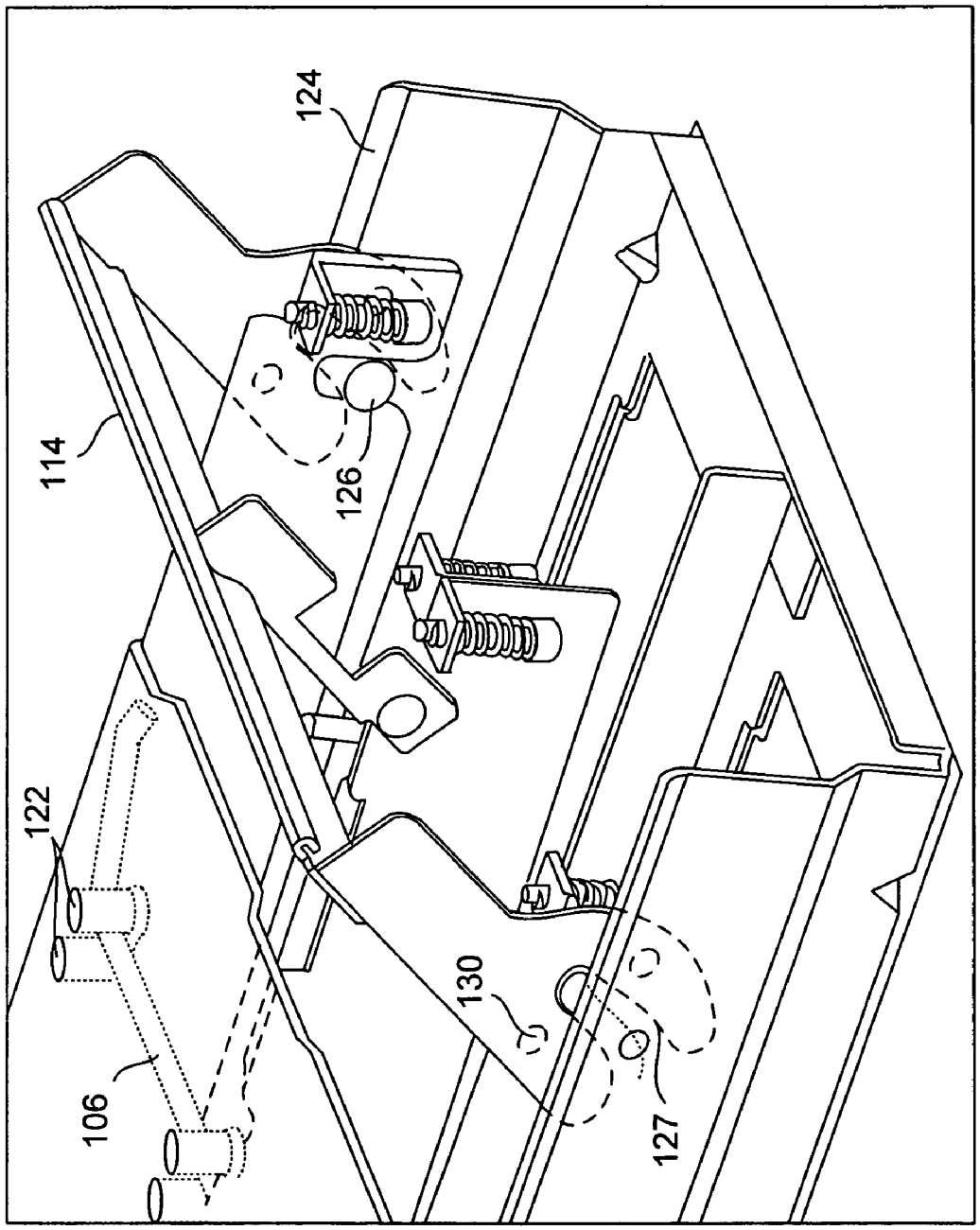

FIGS. 1B and 1C illustrate embodiments of the open retention assembly 100 including the load plate 104, which functions as a cam, attached to a cam handle 114. A user can grasp the cam handle 114 and rotate the load plate 104 about a first pivot point 128 which can be described as a base pivot point in the illustrative example, for example formed by the hinge 110, for the load plate 104. The user can also manipulate the cam handle 114 to rotate about a second pivot point 130 which is illustrated as a handle pivot point. Accordingly, the illustrative structure has a first pivot point 128 for the entire load plate 104 and a second 130 for the cam handle 114. During module installation, the load plate 104 can be rotated about the first pivot point 128 downward toward base 124 to a position where the spring 106, which may be termed a z-axis spring, touches the top surface 112 of the heat sink 120, compressing the spring 106 and applying a load to the enclosed structures. Just prior to contact between the spring 106 and the component 102 or stack of components, a suitably shaped notch 127 in the handle 114 engages the cam pin 126. Further rotation of the handle 114 results in continued rotation of the load plate 104 so that the load spring 106 is compressed with the mechanical advantage of the assembly against the component stack. When the handle 114 is fully closed the spring 106 is at working height. An offset between the handle pivot 130 and the cam pin 126 is established so that the load creates a moment in the handle 114 that holds the assembly closed. The base cam pin 126 can be any suitable form, for example a screw or pin form, constructed of a suitable material, such as stainless steel, that can be machined to enable the cam handle 114 to roll smoothly over the pin 126 and avoid metal wear or shaving of the pin 126 or along sides of the notch 127. Typically, the z-axis spring 106, although a relatively soft spring, is sufficiently stiff that mechanical advantage from the configuration of the load plate 104, handle 114, hinge 110, and pivots 128 and 130 facilitates closure. FIG. 1H illustrates the retention assembly 100 near the closure position with engagement structures, including the cam handle 114 and cam pin 126, shown in greater detail. Pins 126 can be on the interior portion of the assembly 100 since the load plate 104 pivots inside base 124.

Referring to FIGS. 1A, 1B, 1C, and 1E, pictorial diagrams illustrate lateral and overhead perspective views depicting an embodiment of a system 150 that facilitates installation and removal of field-replaceable-units (FRUs) 152 through usage of tool-less retention with distributed compression. The system 150 may be an information handling system, an electronic system, a computing system, or other system type. An illustrative system 150 comprises a housing 154, one or more components 102 and/or FRUs 152, and a substrate 116 that is adapted for mounting in the housing 154 and comprises one or more sockets 156 is configured for accepting the components 102 and/or FRUs 152. The retention assembly 100 comprises a hinged load plate 104 configured for rotational closure over the components 102 and/or FRUs 152, compressing a pre-compressed spring 106 that distributes force of the spring 106 across the components 102 and/or FRUs 152 in tool-less retention.

System components can be configured as field replaceable units, for example combining a heat sink with a processor, CPU, or Application-Specific Integrated Circuit (ASIC) and various devices and components.

In some embodiments, the system 150 can further comprise an integrated circuit 158, a heat sink 120, and a socket 156. The substrate 116 can typically be a circuit board, printed circuit board, motherboard, daughterboard, or the like, which is configured for mounting the socket 156. The retention assembly 100 attaches the integrated circuit 158 to the socket 156 and retains the heat sink 120 to the integrated circuit 158 and the circuit board 116 with a controlled force.

In various embodiments, the system 150 can be an information handling, data processing, communication, electronic, computing system, or other types of systems. The system 150 can comprise a processor (for example integrated circuit 158), a storage coupled to the processor, a heat sink 120, a socket 156, and the substrate 116 in the form of a circuit board configured for mounting the socket 156. The retention assembly 100 can be configured to attach the processor to the socket 156 and to retain the heat sink 120 to the processor and the circuit board 116 with a controlled force.

Figure 2:
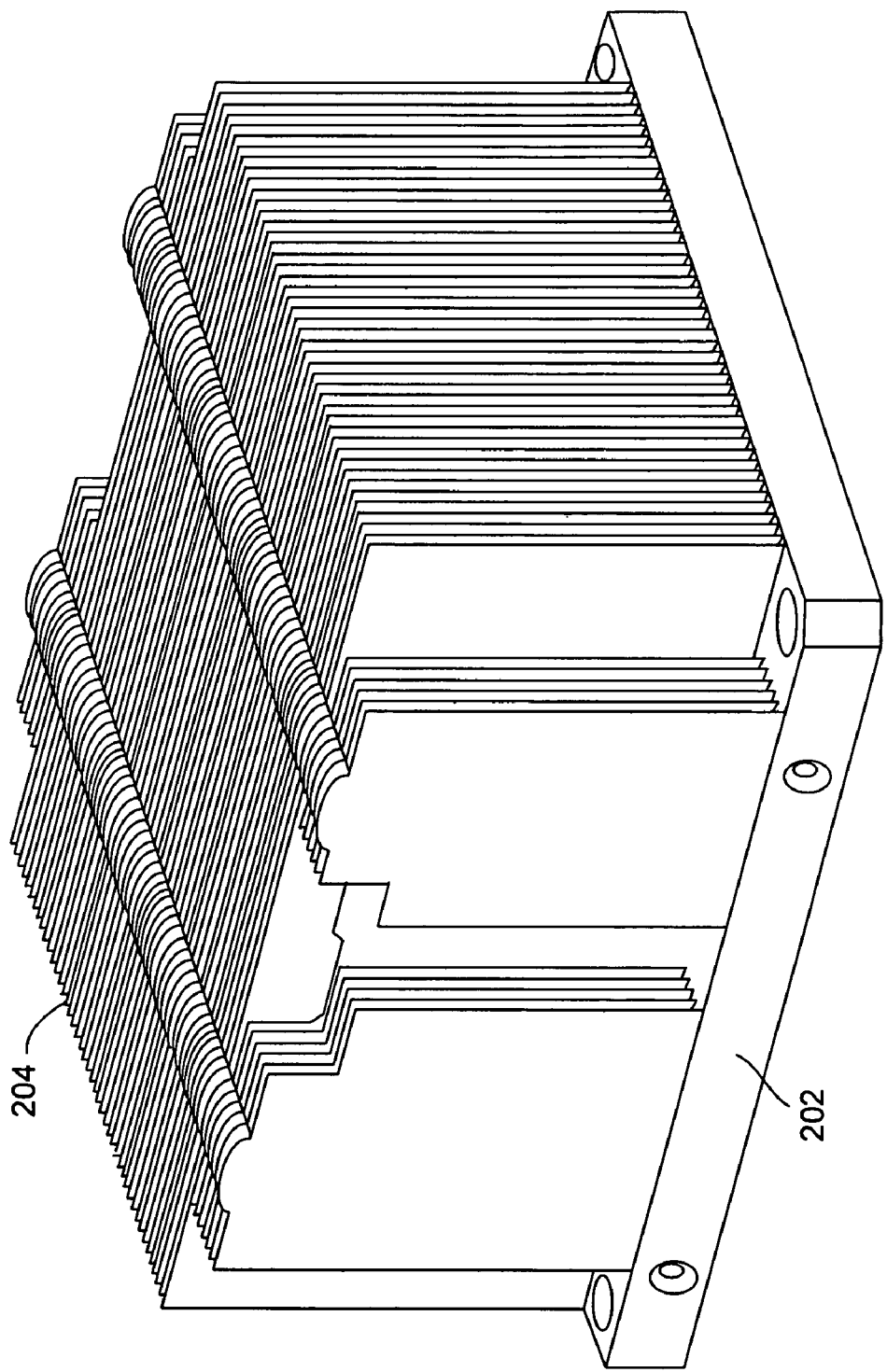
FIG. 2 is a pictorial view illustrating an embodiment of a heat sink that can be retained using distributed compression.

Referring to FIG. 2 in combination with FIGS. 1A, 1B, 1C, 1D, and 1E, a pictorial view illustrates an embodiment of a heat sink 120 that can be retained using distributed compression. The illustrative heat sink 120 comprises a heat sink base 202 and a plurality of heat sink fins 204. The system 150 further comprises one or more attachment hardware 122 configured to hold the spring 106 to the load plate 104 in pre-compression that enables usage of a relatively tall free-height spring and resulting low spring rate, thereby reducing tolerance variation to force applied to the heat sink 120 and the integrated circuit 158 in retention.

The system 150 is constructed to firmly hold one or more components 102 without usage of tools via a tool-less enclosure formed by the hinged load plate 104 with a substantially planar surface 108 that rotates about a hinge 110 to close over one or more components 102, for example enclosing an integrated circuit 158 within a socket 156, overlaid by the heat sink 120. The load plate planar surface 108 can be closed onto the component 102, as is depicted as the heat sink 120, essentially parallel to the substantially planar surface 112 of the heat sink 120. The pre-compressed spring 106 is mounted to the load plate 104 and compresses against the heat sink 120 with a force substantially perpendicular to the a substantially planar surface 112 of the heat sink 120. The load plate 104, hinge 110, and base 124 form a clamshell structure 118 that encloses and retains the socket 156, integrated circuit 158, and heat sink 120.

The retention assembly 100 includes two-halves to "clamshell" the component or components 102, specifically the load plate 104 and the base 124, to effectively contain and support the heat sink 120 and integrated circuit 158.

The illustrative electronic heat sink retention device 100 uses a cam 114 to aid in moving the stiff load plate 104 to compress a z-axis spring 106 to apply a controlled force and retain the heat sink 120 and integrated circuit 158. The cam 114 can be coupled to the load plate 104 and assist load plate movement, compressing the pre-compressed spring 106 at a controlled force that is distributed over the heat sink substantially planar surface and retains the heat sink 120 and an integrated circuit 158, such as a processor, with tool-less retention.

The retention assembly 100 is configured for retaining a component 102 in a system 150 by configuring a hinged load plate 104 as a planar surface 108 that rotates about a hinge 110 for rotational closure over the component 102 with the load plate planar surface 108 essentially parallel to a substantially planar surface 112 of the component 102. A spring 106 is formed that distributes force of the spring 106 across the component 102 in tool-less retention of the component 102 with a force substantially perpendicular to the component substantially planar surface 112. The spring 106 is attached to the load plate 104 with pre-compression.

Terms "substantially", "essentially", or "approximately", that may be used herein, relate to an industry-accepted tolerance to the corresponding term. Such an industry-accepted tolerance ranges from less than one percent to twenty percent and corresponds to, but is not limited to, component values, integrated circuit process variations, temperature variations, rise and fall times, and/or thermal noise. The term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. Inferred coupling, for example where one element is coupled to another element by inference, includes direct and indirect coupling between two elements in the same manner as "coupled".

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims.

What is claimed is:

1. An apparatus comprising:
a retention assembly comprising:
 a pre-compressed spring; and
 a hinged load plate coupled to the pre-compressed spring that is configured for rotational closure over a component and compression of the pre-compressed spring that distributes force of the spring across the component in tool-less retention of the component.

2. The apparatus according to claim 1 further comprising:
the hinged load plate comprising a planar surface that rotates about a hinge to close over the component with the load plate planar surface essentially parallel to a substantially planar surface of the component; and
the pre-compressed spring coupled to the load plate and configured to compress against the component with a force substantially perpendicular to the component substantially planar surface.

3. The apparatus according to claim 1 further comprising:
a cam coupled to the load plate and configured for facilitating movement of the load plate to compress the pre-compressed spring at a controlled force distributed over a substantially planar surface of the component that retains the component with tool-less retention.

4. The apparatus according to claim 1 further comprising:
the pre-compressed spring comprising a spring with a pre-determined free height held in precompression to attain a relatively soft, low spring rate.

5. The apparatus according to claim 1 further comprising:
the pre-compressed spring comprising a spring with a pre-determined free height held in precompression to attain a relatively soft, low spring rate that decreases the affect of tolerance variation within the component and distributes compression force uniformly on the component.

6. The apparatus according to claim 1 further comprising:
a substrate configured for mounting the component; and
the hinged load plate and the substrate configured in combination to form a clamshell structure for enclosing and retaining the component.

7. The apparatus according to claim 1 further comprising:
the retention assembly, hinged load plate, and pre-compressed spring configured for retaining the component wherein the component comprises a heat sink.

8. The apparatus according to claim 1 further comprising:
the retention assembly, hinged load plate, and pre-compressed spring configured for retaining a plurality of components.

9. The apparatus according to claim 1 further comprising:
the pre-compressed spring configured for functionality as a force distributor that distributes contact force substantially uniformly across the component.

10. A system comprising:
a housing;
at least one component;
a substrate adapted for mounting in the housing and comprising at least one socket configured for accepting the at least one component; and
a retention assembly coupled to the substrate and comprising:
 a pre-compressed spring; and
 a hinged load plate coupled to the pre-compressed spring that is configured for rotational closure over the at least one component and compression of the pre-compressed spring coupled to the retention assembly that distributes force of the spring across the at least one component in tool-less retention of the at least one component.

11. The system according to claim 10 further comprising:
an integrated circuit;
a heat sink;
a socket;
the substrate comprising a circuit board configured for mounting the socket; and
the retention assembly coupled to the substrate that is configured to attach the integrated circuit to the socket and to retain the heat sink against the integrated circuit and the circuit board with a controlled force.

12. The system according to claim 10 further comprising:
an information handling, data processing, communication, electronic, and/or computing system comprising:
 a processor;
 a storage coupled to the processor;
 a heat sink;
 a socket;
 the substrate comprising a circuit board configured for mounting the one socket; and
 the retention assembly coupled to the substrate that is configured to attach the processor to the socket and to retain the heat sink against the processor and the circuit board with a controlled force.

13. The system according to claim 12 further comprising:
the heat sink comprising:
 a heat sink base; and
 a plurality of heat sink fins; and
at least one attachment feature configured to hold the at least one spring to the heat sink in pre-compression that reduces tolerance variation to force applied to the heat sink and the integrated circuit in retention.

14. The system according to claim 10 further comprising:
the hinged load plate comprising a planar surface that rotates about a hinge to close over the at least one component with the load plate planar surface essentially parallel to a substantially planar surface of the at least one component; and
the pre-compressed spring coupled to the load plate and configured to compress against the at least one component with a force substantially perpendicular to the component substantially planar surface.

15. The system according to claim 10 further comprising:
a cam coupled to the load plate and configured for facilitating movement of the load plate to compress the pre-compressed spring at a controlled force distributed over a substantially planar surface of the at least one component that retains the at least one component with tool-less retention.

16. The system according to claim 10 further comprising:
the pre-compressed spring comprising a spring with a pre-determined free height held in precompression to attain a relatively soft, low spring rate that decreases the affect of tolerance variation within the at least one component and distributes compression force uniformly on the at least one component.

17. The system according to claim 10 further comprising:
the hinged load plate and a base configured in combination to form a clamshell structure for enclosing and retaining the at least one component.

18. The system according to claim 10 further comprising:

the retention assembly, hinged load plate, and pre-compressed spring configured for retaining the component wherein the component comprises a heat sink.

19. The system according to claim 10 further comprising:

the pre-compressed spring configured for functionality as a force distributor that distributes contact force substantially uniformly across the at least one component.

20. A method for configuring an assembly for retaining a component in a system comprising:

configuring a hinged load plate as a planar surface that rotates about a hinge for rotational closure over the component with the load plate planar surface essentially parallel to a substantially planar surface of the component;

forming a spring to distribute force of the spring across the component in tool-less retention of the component with a force substantially perpendicular to the component substantially planar surface; and attaching the spring to the load plate with pre-compression.

* * * * *